(12) United States Patent
Yano (10) Patent No.: US 11,683,935 B2
(45) Date of Patent: Jun. 20, 2023

(54) NOR FLASH MEMORY

(71) Applicant: Winbond Electronics Corp., Taichung (TW)

(72) Inventor: Masaru Yano, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 306 days.

(21) Appl. No.: 16/111,237

(22) Filed: Aug. 24, 2018

(65) Prior Publication Data

US 2019/0067325 A1 Feb. 28, 2019

(30) Foreign Application Priority Data

Aug. 24, 2017 (JP) .............................. JP2017-160921

(51) Int. Cl.
*G11C 16/04* (2006.01)
*H10B 43/27* (2023.01)
(Continued)

(52) U.S. Cl.
CPC ......... *H10B 43/27* (2023.02); *G11C 16/0466* (2013.01); *H10B 41/00* (2023.02);
(Continued)

(58) Field of Classification Search
CPC . G11C 11/5671; G11C 16/0466; G11C 16/06; H01L 27/11568; H01L 27/11575;
(Continued)

(56) References Cited

U.S. PATENT DOCUMENTS

| 8,189,371 B2 | 5/2012 | Katsumata et al. |
| 2011/0103149 A1* | 5/2011 | Katsumata ......... G11C 16/0483 |
| | | 365/185.18 |
| 2017/0221813 A1* | 8/2017 | Kim .................. H01L 27/11582 |

FOREIGN PATENT DOCUMENTS

| CN | 105990361 | 10/2016 |
| JP | H0479369 | 3/1992 |

(Continued)

OTHER PUBLICATIONS

"Office Action of Japan Counterpart Application", dated Sep. 18, 2018, with English translation thereof, p. 1-p. 8.
(Continued)

*Primary Examiner* — Meiya Li
(74) *Attorney, Agent, or Firm* — JCIPRNET (57) ABSTRACT

A NOR flash memory comprising a memory cell having a three-dimensional structure for saving power consumption is provided. The flash memory of the present invention includes a pillar part, a charge accumulating part, an insulating part, a control gate and a selecting gate. The pillar part extends in a vertical direction from a surface of a substrate and includes a conductive semiconductor material. The charge accumulating part is formed by surrounding the pillar part. The insulating part is formed by surrounding the pillar part. The control gate is formed by surrounding the charge accumulating part. The selecting gate is formed by surrounding the insulating part. One end of the pillar part is electrically connected to a bit line via a contact hole and another one end of the pillar part is electrically connected to a conductive region formed on the surface of the substrate.

18 Claims, 8 Drawing Sheets

(51) Int. Cl.
  *H10B 41/00* (2023.01)
  *H10B 43/30* (2023.01)
  *H10B 43/35* (2023.01)
  *H10B 43/50* (2023.01)
  *G11C 16/06* (2006.01)
  *G11C 11/56* (2006.01)
  *G11C 16/10* (2006.01)

(52) U.S. Cl.
  CPC ............. *H10B 43/30* (2023.02); *H10B 43/35* (2023.02); *H10B 43/50* (2023.02); *G11C 11/5671* (2013.01); *G11C 16/06* (2013.01); *G11C 16/10* (2013.01)

(58) Field of Classification Search
  CPC ........... H01L 27/11582; H01L 27/1157; H01L 27/11524; H01L 27/11551; H01L 29/7926; H01L 27/11529; H01L 27/11573; H01L 27/11578; H01L 27/1158; H10B 41/00; H10B 43/27; H10B 43/30; H10B 43/35; H10B 43/50
  See application file for complete search history.

(56) References Cited

FOREIGN PATENT DOCUMENTS

| | | |
|---|---|---|
| JP | H07183409 | 7/1995 |
| JP | H08213611 | 8/1996 |
| JP | H11110987 | 4/1999 |
| JP | H11297689 | 10/1999 |
| JP | 2003100092 | 4/2003 |
| JP | 2005182909 | 7/2005 |
| JP | 2008218638 | 9/2008 |
| JP | 2008226979 | 9/2008 |
| JP | 2008263181 | 10/2008 |
| JP | 2009283740 | 12/2009 |
| JP | 2011035169 | 2/2011 |
| JP | 2011108761 | 6/2011 |
| JP | 2014170936 | 9/2014 |
| JP | 201658494 | 4/2016 |
| TW | I574380 | 3/2017 |

OTHER PUBLICATIONS

"Office Action of Japan Counterpart Application", dated Jan. 22, 2019, p. 1-p. 3.

* cited by examiner

NOR FLASH MEMORY

CROSS-REFERENCE TO RELATED APPLICATION

This application claims the priority benefit of Japan application serial no. 2017-160921, filed on Aug. 24, 2017. The entirety of the above-mentioned patent application is hereby incorporated by reference herein and made a part of this specification.

BACKGROUND OF THE INVENTION

Field of the Invention

The invention relates to a NOR flash memory, and particularly relates to a three-dimension structure of a memory cell.

Description of Related Art

In order to improve the degree of integration of NOR flash memory, a virtual grounding system and a multi-level system have been adopted. In a typical virtual grounding system, such as disclosed in Japan Patent Publication 2003-100092 and Japan Patent Publication 2000-110987, a source/drain of a memory cell is shared with a source/drain of a memory cell adjacent in a row direction, and the common sources/drains are electrically connected to bit lines. When performing a readout, a ground potential is applied to the source of the selected memory cell, a readout voltage is applied to the drain of the selected memory cell, and the source/drain of the adjacent memory cell sits in a floating state.

In the multi-level system, charges to the floating gate or trapped charges in a charge accumulation region are controlled so that a plurality of thresholds can be set for a memory cell. Japan Patent Publication 2009-283740 discloses a mirror bit type flash memory being a charge trapping multi-level memory. This flash memory has an ONO (oxide-nitride-oxide) film between a surface of a silicon substrate and a gate electrode to trap charges at an interface between the oxide film and the nitride film. By exchanging the voltage applied to source/drain, charges are held on a source side and a drain side of the nitride film (charge accumulating layer) respectively, thereby storing a 2-bit information in one memory cell. In addition, a structure below is also proposed: ONO films are separately formed near the two ends of the gate electrode, so that regions for accumulating charges are physically separated from one and the other.

In addition, along with a high integration of semiconductor devices, a three-dimensional NAND flash memory in which memory cells are stacked three-dimensionally or vertically has been developed (for example, Japan Patent Publication 2016-58494). In this flash memory, a plurality of pillars extending vertically from the surface are formed on a semiconductor substrate, and sidewalls of the pillars are surrounded by a storage film including, for example, a tunnel insulation layer, a charge accumulating layer, and a block insulation layer.

In the NOR flash memory, memory cells have been shrunk while high operating current and high integration are required, but the scaling is approaching the limit. If a channel length of the memory cell becomes shorter, a distance between the source and the drain becomes shorter. Or, if design rule becomes smaller, the distance between the gate electrode and the source/drain becomes shorter. Accordingly, the memory cell may be turned on arbitrarily due to unexpected breakdowns, thereby causing read or write error and so on. Moreover, even in such a situation, it is still required to shorten programming or erasing operating time.

SUMMARY OF THE INVENTION

An objective of the invention is to solve such conventional problems and to provide a NOR flash memory including a memory cell having a three-dimensional structure and a method of manufacturing the same.

The NOR flash memory of the invention includes: a substrate; a pillar part which extends in a vertical direction from a surface of the substrate and includes a conductive semiconductor material; a charge accumulating part formed by surrounding the pillar part; an insulating part formed by surrounding the pillar part; a control gate formed by surrounding the charge accumulating part; and a selecting gate formed by surrounding the insulating part. One end of the pillar part is electrically connected to a bit line via a contact hole and another end of the pillar part is electronically connected to a reference potential which is supplied to the substrate. A memory cell including the charge accumulating part and the control gate is connected in series with a selecting transistor including the insulating part and the selecting gate.

According to the present invention, the memory cell has a three-dimensional structure, whereby an active region of the memory cell may be formed without being limited by a two-dimensional scale, and integration of the memory cells and high operating current may be realized at the same time. Furthermore, by forming the memory cell in series with the selecting transistor, power consumption during programming may be further reduced.

DETAILED DESCRIPTION OF DISCLOSED EMBODIMENTS

In an embodiment, a three-dimensional NOR flash memory is illustrated. Further, diagrams are drawn to facilitate the descriptions of the invention, wherein a scale of for each part is not necessarily the actual size of the element.

Figure 1A:
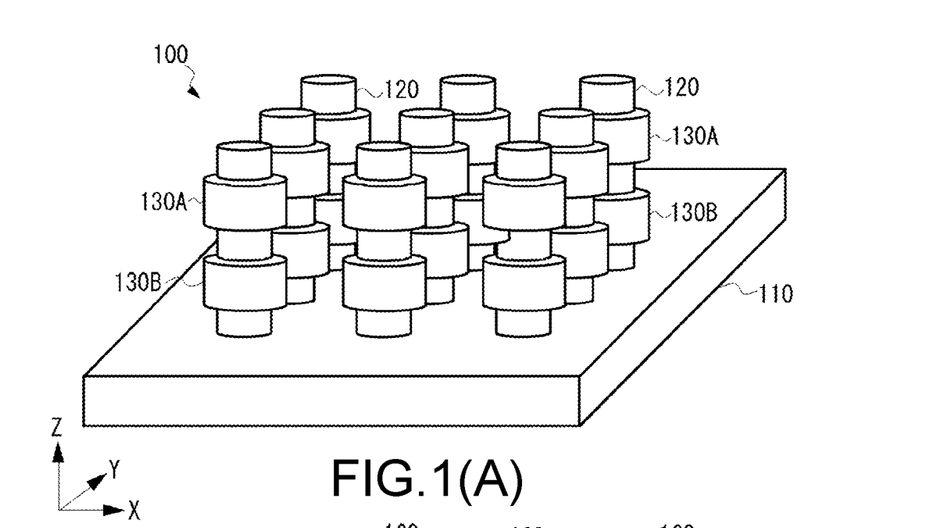
FIG. 1(A) is a schematic perspective diagram of a pillar part of a memory cell constituting a NOR flash memory of an exemplary embodiment of the invention.
Figure 1B:
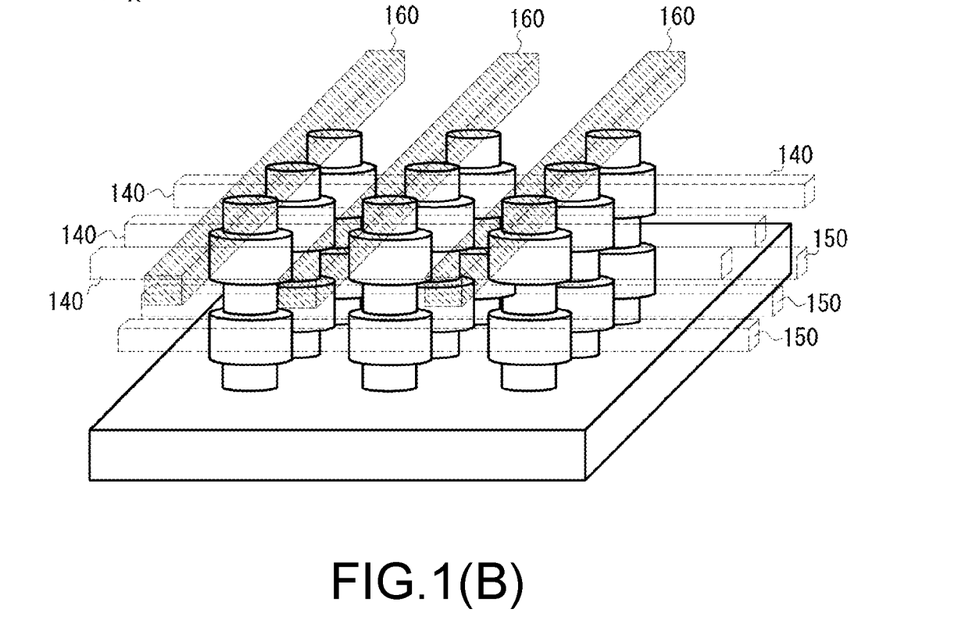
FIG. 1(B) is a schematic perspective diagram of a wiring layer of a bit line, a control gate, and a selecting gate.

FIG. 1(A) is a schematic perspective diagram of a pillar part constituting a memory cell of a NOR flash memory according to an exemplary embodiment of the present invention, FIG. 1(B) is a schematic perspective diagram of a bit line, a control gate, and a selecting gate connected to a pillar part.

A NOR flash memory 100 of the exemplary embodiment as shown in FIG. 1(A), includes: a semiconductor substrate 110; a plurality of pillar parts 120 extending in a vertical direction (Z direction) from a surface of the semiconductor substrate 110; and charge accumulating parts 130A and 130B, each formed in a closed band shape to surround a corresponding one of the plurality of pillar parts 120. The plurality of pillar parts 120 are arranged in a two-dimensional array on the semiconductor substrate 110, and the two charge accumulating parts 130A and 130B are formed separately on each pillar part 120. A plurality of control gates (also called word lines) 140 is formed and extend in an X direction, and charge accumulating parts 130A in a row direction are commonly connected by each control gate 140. A plurality of selecting gates 150 are formed and extend in the X direction, and charge accumulating parts 130B in the row direction are commonly connected by each selecting gate 150. Furthermore, a plurality of bit lines 160 are formed and extend in a Y direction, and ends (drain regions) of the pillar parts 120 are commonly connected by each bit line 160 in a column direction. A transistor including the control gate 140 and the charge accumulating part 130A constitutes a memory cell MC, and a transistor connected in series to the memory cell including the selecting gate 150 and the charge accumulating part 130B functions as a selecting transistor ST for limiting current by a switching function.

The semiconductor substrate 110 includes, for example, a silicon substrate; the pillar part 120 includes a conductive semiconductor material, for example, a cylindrical silicon or a polycrystalline silicon. The pillar part 120 is disposed between a bit line and a source line and forms a local bit line. The pillar part 120 includes an active region. In a case where the memory cell and the selecting transistor ST for limiting current have an n-type metal oxide semiconductor (MOS) structure, the pillar part 120 includes, for example, a p-type silicon or a polycrystalline silicon.

Figure 2A:
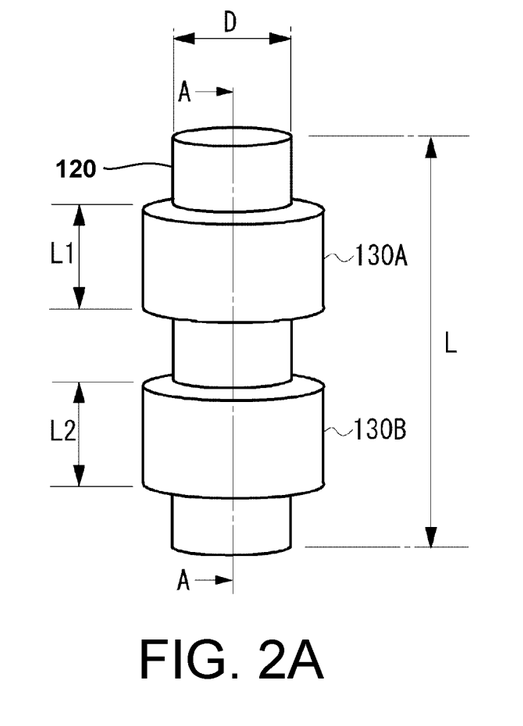
FIG. 2(A) is a perspective diagram of a pillar part of a memory cell of an exemplary embodiment of the invention.
Figure 2B:
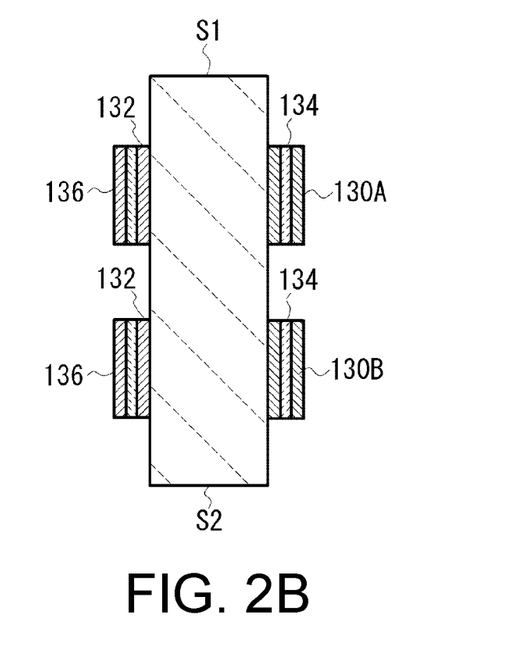
FIG. 2(B) is a cross-sectional diagram of line A-A thereof.

FIG. 2(A) is a perspective diagram of a pillar part 120, and FIG. 2(B) is a cross-sectional diagram of line A-A thereof. The pillar part 120, for example, has a cylindrical shape having a diameter D and a length L in a vertical direction. However, the pillar part 120 may also be a prism shape. The diameter D of the pillar part 120 is determined based on a size of an opening formed in a buffer layer as described thereafter, and the length L may be determined based on a thickness of the buffer layer. A drain region is formed at one end S1 of the pillar part 120, and a source region is formed at another end S2. When the memory cell is an n-type MOS structure, the drain region and the source region are respectively n-types.

Each of the charge accumulating parts 130A and 130B completely surrounds the pillar part 120 in a band shape. A length of the charge accumulating part 130A in a vertical direction is L1 (L1<L), and a length of the charge accumulating part 130B in a vertical direction is L2 (L2<L). The lengths L1 and L2 may be equal or different. Moreover, in one example, a space is formed between the charge accumulating part 130A and the charge accumulating part 130B.

The charge accumulating part 130A includes a layer or an interface for accumulating charges therein. Ideally, the charge accumulating part 130A contains a substance with a relatively high dielectric constant to provide a high capacitive coupling between the control gate 140 and the pillar part 120. For example, the charge accumulating part 130A includes an oxide film (O) 132, a nitride film (N) 134, and an oxide film (O) 136 sequentially ordered from the inside, and traps charges at the interfaces of the ONO film.

Preferably, the charge accumulating part 130B has the same structure as that of the charge accumulating part 130A, whereby simplifying the manufacturing process of the charge accumulating parts 130A and 130B. Of course, since the selecting transistor including the charge accumulating part 130B does not necessarily need charge accumulation property as that of the memory cell including the charge accumulating part 130A, the charge accumulating part 130B may be an insulating film such as $SiO_2$.

As shown in FIG. 1(B), the control gate 140 extends in an X direction to surround the charge accumulating parts 130A, and the selecting gates 150 extends in the X direction to surround the charge accumulating parts 130B. Drain regions of the ends S1 of the pillar parts 120 arranged in a column are jointly connected by the bit lines 160, and source regions of ends S2 of the pillar parts 120 are respectively electrically connected to the source lines on the semiconductor substrate 110 to which a reference potential is supplied.

Figure 3:
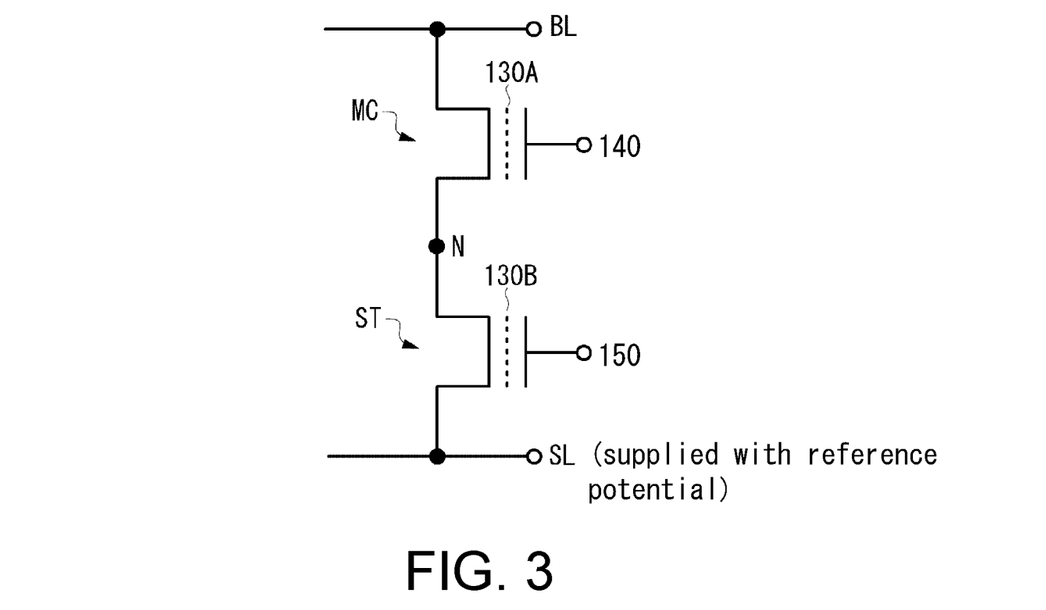
FIG. 3 is an equivalent circuit diagram of a NOR memory cell.

FIG. 3 is an equivalent circuit diagram representing a memory cell of the exemplary embodiment. The memory cell MC and the selecting transistor ST are connected in series, a drain region of the memory cell MC is electrically connected to a bit line BL, and a source region of the selecting transistor ST is electrically connected to a source line SL. The source region of the memory cell MC is shared with the drain region of the selecting transistor ST at a node N. The pillar parts 120 formed between the bit line BL and the source line SL provide a direct current path of the memory cell MC and the selecting transistor ST.

When a voltage is applied to the control gate 140, an electric field is applied to the pillar part 120 through the charge accumulating part 130A. If electrons are not accumulated in the charge accumulating part 130A, a larger electric field would be applied to the pillar part as compare with the instance when the electrons are accumulated. When the voltage applied to the control gate 140 is above a threshold, an inversion layer is formed on a surface of the pillar part 120, and the memory cell MC becomes conductive. If the voltage applied is smaller than a threshold, the inversion layer is not formed on the surface of the pillar part 120, and the memory cell MC is non-conductive. When electrons are accumulated in the charge accumulating part 130A, the threshold of the memory cell MC becomes higher. If electrons are not accumulated, the threshold is lower.

When a voltage is applied to the selecting gate 150, an electric field is applied to the pillar part 120 through the charge accumulating part 130B. The charge accumulating part 130B does not actually accumulate electrons or only accumulate very few electrons. Therefore, a threshold of the selecting transistor ST is slightly increased when the very few electrons are accumulated in the charge accumulating part 130B. When the selecting gate 150 apply a voltage above the threshold, an inversion layer is formed on a surface of the pillar parts 120 and the selecting transistor ST becomes conductive. If the applied voltage is smaller than the threshold, the selecting transistor ST is non-conductive.

A periphery of the cylindrical pillar part 120 is surrounded by the band-like charge accumulating parts 130A and 130B, thereby an electric field acting on the periphery of the pillar part 120 by the control gate 140 and the selecting gate 150 in equal manner forms a ring-shaped inversion layer on a periphery of the pillar part 120. When the selecting transistor ST is in a conductive state, the node N is electrically coupled to the source line SL. At this time, an electric potential of the node N is equal to or slightly higher than an electric potential of the source line SL. When the memory cell MC and the selecting transistor ST becomes conductive, a current path is formed between the bit line BL and the source line SL.

For example, when a selected memory cell MC being an n-type MOS structure is programmed, a certain positive voltage, for example, 5 V, is supplied to a selected bit line BL, a GND voltage, for example, is supplied to a selected source line SL, a positive programming voltage Vpgm is supplied to a selected word line WL (control gates 140), and a positive selecting voltage Vsel is supplied to the selecting gates 150. The programming voltage Vpgm is greater than the selecting voltage Vsel, the programming voltage Vpgm is, for example, 8 V, and the selecting voltage Vsel is, for example, 3 V.

When the selected memory cell MC becomes conductive by the programming voltage Vpgm, and the selecting transistor ST connected in series with the selected memory cell MC becomes conductive by the selecting voltage Vsel, current flows from the selected bit line BL to the selected source line SL. At this time, since the selecting transistor ST is turned on by the selecting voltage Vsel which is smaller than the programming voltage Vpgm, only the current smaller than the current flowing through the selected memory cell MC can flow through. That is, the selecting transistor ST limits the current supplied from the selected memory cell MC to the source line SL. Thus, a large number of electrons are generated at the node N which is the source region of the selected memory cell MC. By setting the electric potential of the node N being approximately at a GND potential level, the electrons generated at the node N are transferred to the charge accumulating part 130A due to a potential difference between the drain and source of the selected memory cell MC. Therefore, for example, data "0" is programmed in the selected memory cell MC.

In a readout operation of the selected memory cell MC, a readout voltage Vread is applied to the selected word line WL, and the selecting voltage Vsel is applied to the selecting gates 150 of the selecting transistors ST connected in series with the selected memory cell MC. The readout voltage Vread is equal to the selecting voltage Vsel, for example, 3 V. A certain positive voltage (for example, 5 V) is supplied to the selected bit line BL, and a GND voltage is, for example, supplied to the selected source line SL. In the case where electrons are accumulated in the selected memory cell MC (when data "0" is stored), the selecting transistor ST is in a conductive state, but since the selected memory cell MC is in a non-conductive state, the electric potential of the selected bit line BL does not change. In the case where there is no accumulation of electrons in the selected memory cell MC (when data "1" is stored), both the selecting transistor ST and the selected memory cell MC becomes conductive, so that the electric potential of the selected bit line BL drops or current flows from the selected bit line BL to the selected source line SL. The electric potential or current of the selected bit line BL is detected by a sense amplifier.

In an erase operation of the selected memory cell MC, similar to a NAND flash memory, charges accumulated in the charge accumulating part 130A are released to a channel region by FN tunneling. For example, a negative erase voltage Vers is applied to the word line WL of the selected memory cell MC, and a positive voltage is applied to the selected bit line BL and the selected source line SL, thus, electrons tunnel through the charge accumulating part 130A and are released to the channel region. The selecting gate 150 may also be in a floating state, or when it is desired to release electrons that may be accumulated in the charge accumulating part 130B, the negative erase voltage Vers may also be applied in the same manner as the selected memory cell MC. Furthermore, erasing of the selected memory cell MC may also collectively erase memory cells connected to the selected bit line and the selected source line.

Figure 4A:
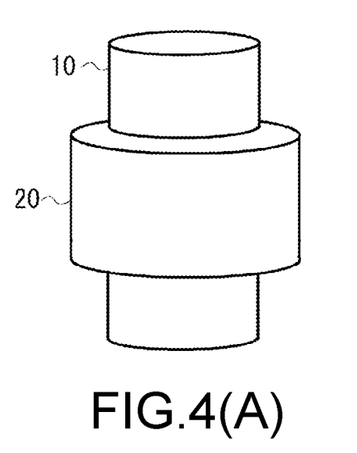
FIG. 4(A) is a comparative example of a memory cell forming one transistor in a pillar part.
Figure 4B:
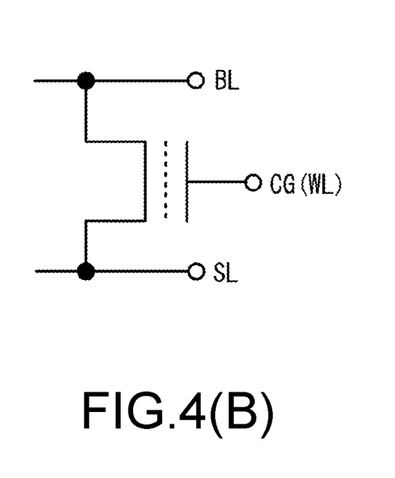
FIG. 4(B) is an equivalent circuit diagram of a comparative example thereof.

Next, an effect of the memory cell of the exemplary embodiment will be described. FIG. 4(A) and FIG. 4(B) represent a memory cell (comparative example) of a three-dimensional structure in which one transistor is formed in one pillar part. As shown in FIG. 4(A) and FIG. 4(B), a charge accumulating part 20 is formed to surround a periphery of a pillar part 10, and a control gate CG is connected to the charge accumulating part 20. When the selected memory cell is being programmed, a positive voltage is applied to the bit line BL, a GND voltage is applied to the source line SL, a positive programming voltage is applied to the word line so that the selected memory cell is turned on. Thus, current flows from the drain to the source, and hot electrons generated in the channel are injected into the charge accumulating part 20. When performing such channel hot electron injection, a certain amount or more of the channel current must flow from the drain to the source. However, a voltage drop will occur in the pillar part 10 according to a length in a vertical direction. Therefore, it is required to apply a relatively high programming voltage to the control gate CG, so that more of the drain current will flow. As a result, power consumption during programming increases.

In contrast, in a structure of a memory cell of the exemplary embodiment, two transistors are formed in series in one pillar part 120. During programming, a selecting transistor ST is used to limit current supplied from the selected memory cell MC. As a result, hot electrons are generated on a source side of the selected memory cell, and the generated hot electrons are injected from the source side of the selected memory cell to the charge accumulating part 130A. Therefore, a large channel current like the channel hot electron injection is not required, and power consumption during programming can be reduced. In turn, a programming voltage Vpgm applied to the selected word line may be reduced, thereby suppressing programming interferences to the adjacent memory cells which are not selected.

Figure 5:
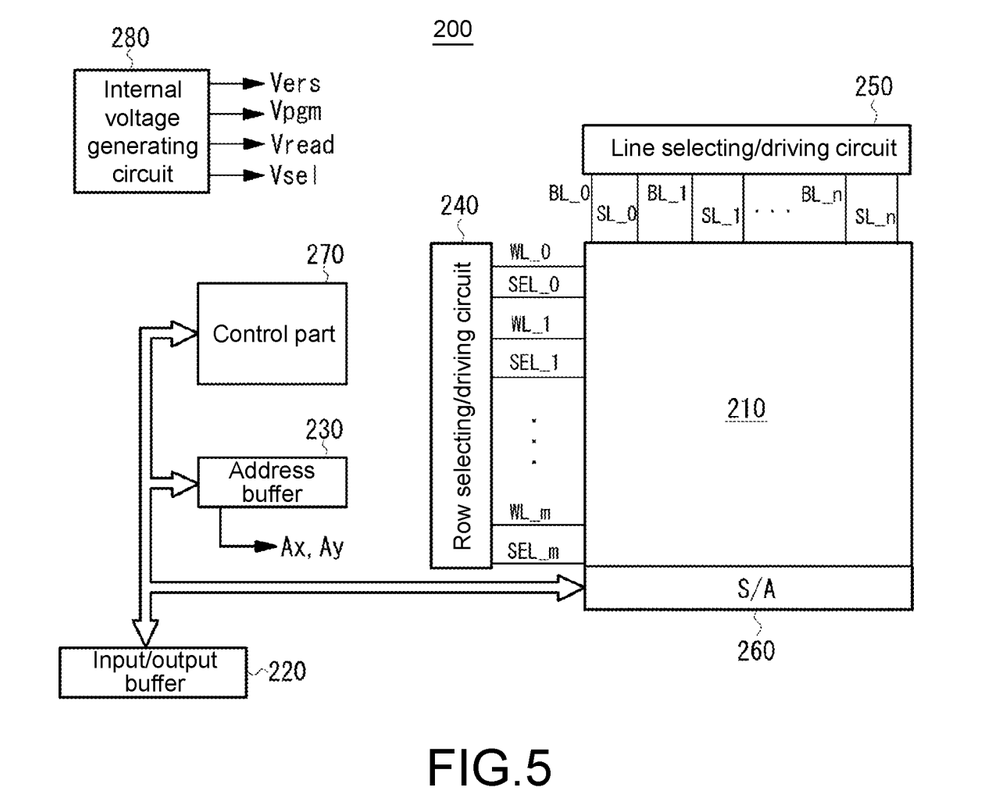
FIG. 5 is a block diagram representing an electrical schematic structure of a NOR flash memory of an exemplary embodiment of the invention.

FIG. 5 is a block diagram representing an electrical schematic structure of a NOR flash memory of the exemplary embodiment. The NOR flash memory of the exemplary embodiment requires a new structure for turning on/off the selecting transistor ST, but aside from that, the foregoing structure is the same as conventional NOR flash memory.

A flash memory 200 of the exemplary embodiment includes a memory cell array 210 including memory cells arranged in m rows×n columns, an input/output buffer 220, an address buffer 230, a row selecting/driving circuit 240, a column selecting/driving circuit 250, a sense amplifier 260, a control part 270 and an internal voltage generating circuit 280. Each memory cell is connected to a selecting transistor ST in series as shown in FIG. 3. The input/output buffer 220 is connected to an external input/output terminal to maintain input/output data. The address buffer 230 maintains address data input by the input/output buffer 220. The row selecting/driving circuit 240 selects and drives one of word lines WL_0, WL_1, . . . WL_m and selecting gates SEL_0, SEL_1, . . . SEL_m based on a row address Ax maintained by the address buffer 230. The column selecting/driving circuit 250 selects and drives one of bit lines BL_0, BL_1, . . . BL_n and source lines SL_0, SL_1, . . . SL_n based on a column address Ay maintained by the address buffer 230. The sense amplifier 260 senses an electrical potential or a voltage of the selected bit line during a readout operation or the like. The control part 270 controls the memory cell array 210, the input/output buffer 220, the address buffer 230, the row selecting/driving circuit 240, the column selecting/driving circuit 250, the sense amplifier 260 and the internal voltage generating circuit 280 based on a command or the like input from the outside via the input/output buffer 220 to execute a readout operation, a programming operation, and an erasing operation. The internal voltage generating circuit 280 generates various voltages (programming voltage Vpgm, readout voltage Vread, erase voltage Vers, and so on) required for the programming operation, the readout operation, the erasing operation, and so on.

For example, when the row selecting/driving circuit 240 selects a p-th word line WL_p based on the row address Ax, a voltage (for example, one of programming voltage Vpgm, readout voltage Vread, and erase voltage Vers) corresponding to the operation is selected simultaneously to drive the selected word line WL_p, and a corresponding selecting gate SEL_p is also selected and driven by the selecting voltage Vsel. As a result, the selected memory cell MC is electrically connected to the selected source line SL by the selecting transistor ST.

In addition, in the exemplary embodiment, as shown in FIG. 1(B), the control gates 140 and the selecting gates 150 extend along the X direction, but the invention is not limited thereto. The control gates 140 and the selecting gates 150 may also extend in different directions as long as the selecting transistor ST connected in series with the memory cell MC can be selected when the memory cell is selected.

Furthermore, in the exemplary embodiment, an example of the selecting transistor ST including the charge accumulating part 130B as a gate insulating film is shown, but the selecting transistor ST is only required to have a turn on/off switching function, and it is not necessary to provide a charge accumulating function. The reason as to why the charge accumulating part 130B is being used as the gate insulating film of the selecting transistor ST is because it has the same structure as the charge accumulating part 130A of the memory cell and would be easy to manufacture. However, the gate insulating film of the selecting transistor ST may also be the same as a general MOS transistor, which is a gate oxide film such as $SiO_2$ that does not have a charge accumulating function.

In addition, in the exemplary embodiment, the charge accumulating part 130A and the charge accumulating part 130B are physically separated from each other, but the invention is not limited thereto. As shown also in FIG. 6, one charge accumulating part 130 which not only overlaps with the charge accumulating part 130 in a length L1 in a vertical direction, but also the selecting gate 150 in a length L2 in the vertical direction is formed on the pillar part 120. The equivalent circuit in this case is also shown in FIG. 3.

Figure 6:
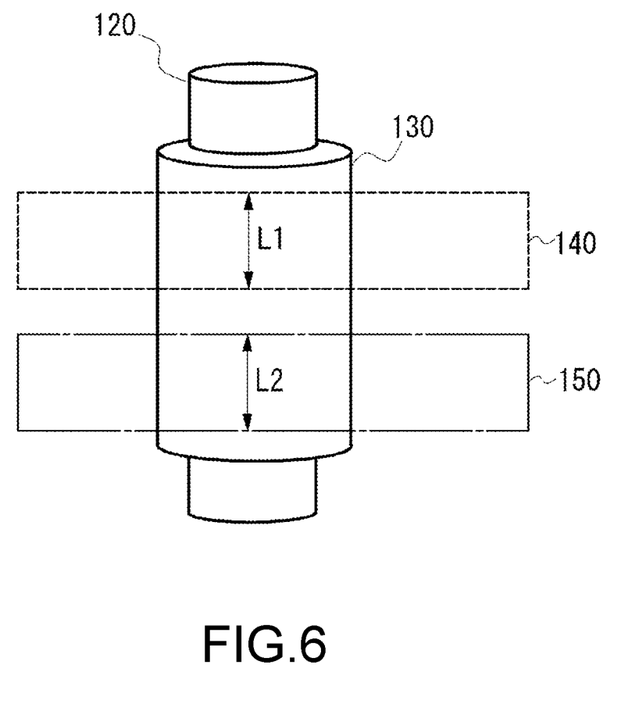
FIG. 6 is a diagram representing a variation of a memory cell of an exemplary embodiment of the invention.
Figure 7A:
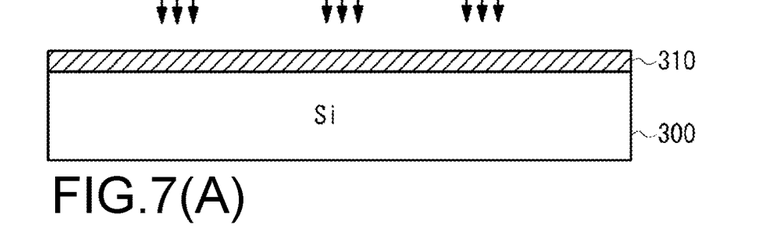
FIG. 7(A) to FIG. 7(D), FIG. 8(A) to FIG. 8(C), FIG. 9(A) to FIG. 9(C) and FIG. 10(A) to FIG. 10(C) are schematic cross-sectional diagrams describing a manufacturing process of a NOR flash memory of an exemplary embodiment of the invention.

Please refer to FIG. 7(A) to FIG. 10(C) for a description of a manufacturing method of a memory cell of the exemplary embodiment. Here, a method of manufacturing a memory cell including the structure in which the control gate 140 and the selecting gate 150 are overlapped with one continuous charge accumulating part 130 as shown in FIG. 6 will be exemplified. As shown in FIG. 7(A), a silicon substrate 300 is prepared. The silicon substrate 300 is a semi-insulating i-type or a p-type. Impurities such as phosphorus or arsenic are ion-implanted into the surface of the silicon substrate 300, thereby forming an n+ high impurity layer 310 on the surface of the silicon substrate 300. The energy and time of the ion implantation are appropriately selected according to an impurity concentration or a film thickness of the high impurity layer 310. The high impurity layer 310 constitutes the source line SL of the memory cell array.

Figure 7B:
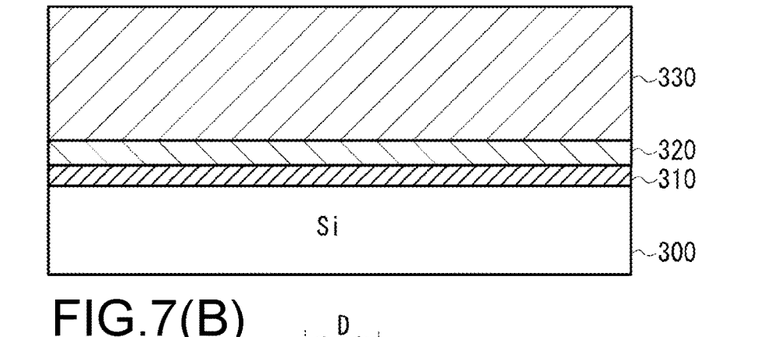

As show in FIG. 7(B), a first buffer layer 320 is formed on an entire surface of the high impurity layer 310. The first buffer layer 320 is, for example, a silicon oxide film ($SiO_2$). Next, a second buffer layer 330 is formed on an entire surface of the first buffer layer 320. The second buffer layer 330 is, for example, a silicon nitride film (SiN). The first buffer layer 320 and the second buffer layer 330 are, for example, deposited by chemical vapor deposition (CVD).

Figure 7C:
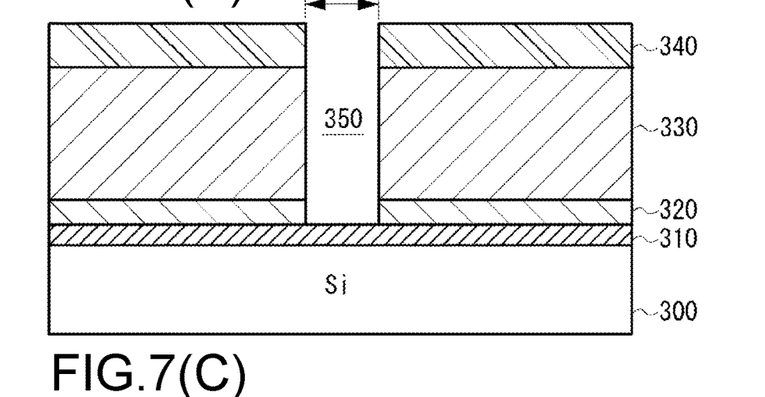

Next, as shown in FIG. 7(C), a mask layer 340 is formed on the second buffer layer 330. The mask layer 340 is, for example, a photoresist layer. In the mask layer 340, a round shape opening of a diameter D is formed by a photolithography process. Next, the mask layer 340 is used as an etching mask for performing anisotropic dry etching on the second buffer layer 330 and the first buffer layer 320. Preferably, an etchant having a high selectivity between the first buffer layer 320 and the high impurity layer 310 is selected. Thus, etching can be relatively easily stopped at a time when the high impurity layer 310 is exposed. As a result, in the second buffer layer 330 and the first buffer layer 320, an opening 350 with the diameter D exposing the high impurity layer 310 is formed.

Figure 7D:
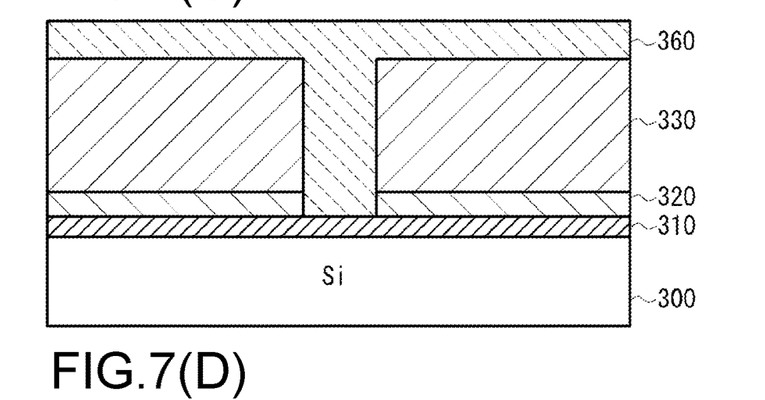

Next, the mask layer 340 is removed and, as shown in FIG. 7(D), a polycrystalline silicon layer 360 is formed on an entire surface of the second buffer layer 330 including the opening 350 by the CVD or the like. The polycrystalline silicon layer 360 fills up the opening 350 and the polycrystalline silicon filled in the opening 350 becomes pillar parts that provide a local bit line or a channel region of the memory cell. In a case where the memory cell is an n-type MOS structure, the polycrystalline silicon layer 360 may be a p-type polycrystalline silicon doped with boron or the like. In an alternative embodiment, the pillar parts may include a material other than the polycrystalline silicon. In this case, a silicon layer is epitaxially grown starting from the high impurity layer 310 exposed by the opening 350. The silicon layer fills the opening 350 and grows until the entire surface of the second buffer layer 330 is covered.

Figure 8A:
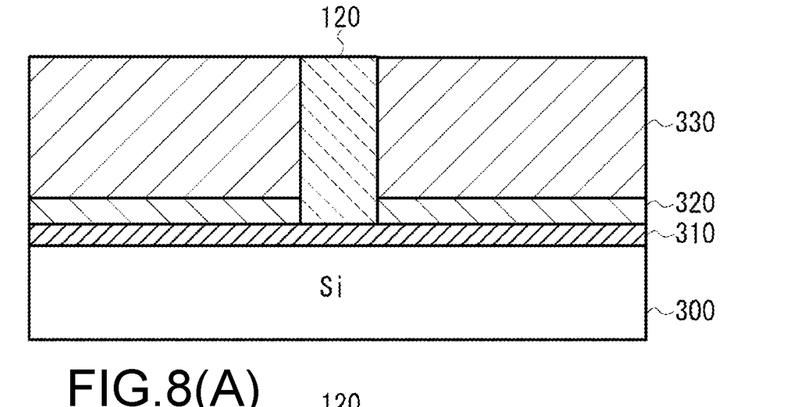

Next, as shown in FIG. 8(A), the polycrystalline silicon layer 360 is planarized by chemical mechanical polishing (CMP) or etched back until the second buffer layer 330 is exposed. As a result, the pillar part 120 including the polycrystalline silicon is formed in the opening 350. An axial length of the pillar parts 120 defines a length of the local bit line of the memory cell. Next, ion implantation of phosphorus or arsenic is performed on the entire surface of the second buffer layer 330 and the pillar part 120 to form an n-type drain region at an end of the pillar part 120. A desired depth and impurity concentration of the drain region can be obtained by appropriately selecting the energy and time of ion implantation. In addition to the ion implantation, for example, an n+ layer may be formed on the entire surface of the second buffer layer 330 and the pillar part 120 to form the drain region at an end of the pillar part 120 by a solid-phase diffusion.

Figure 8B:
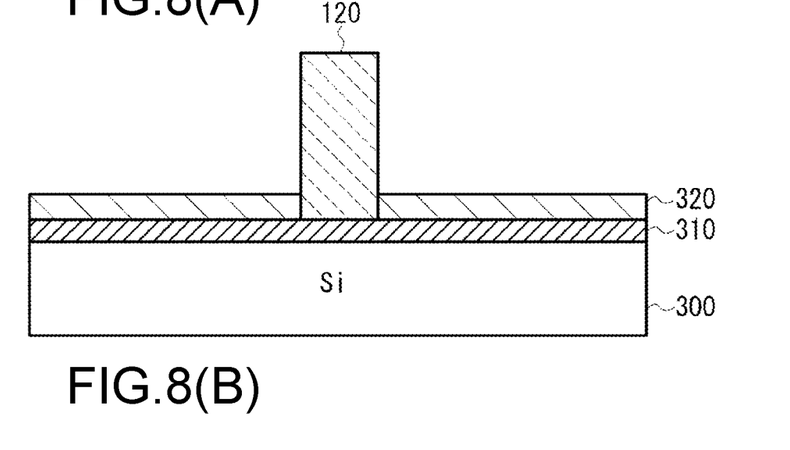

Next, as shown in FIG. 8(B), the second buffer layer 330 is removed. Preferably, the second buffer layer 330 is removed by selective wet etching of the first buffer layer 320. As a result, only a bottom portion of the pillar part 120 is surrounded by the first buffer layer 320, that is, the side and upper portions of the pillar parts 120 are exposed. Here, it should be noted that a length of the pillar parts 120 and a range of the exposed portion may be determined by an appropriate selection of a thickness of the first buffer layer 320 or a thickness of the second buffer layer 330.

Figure 8C:
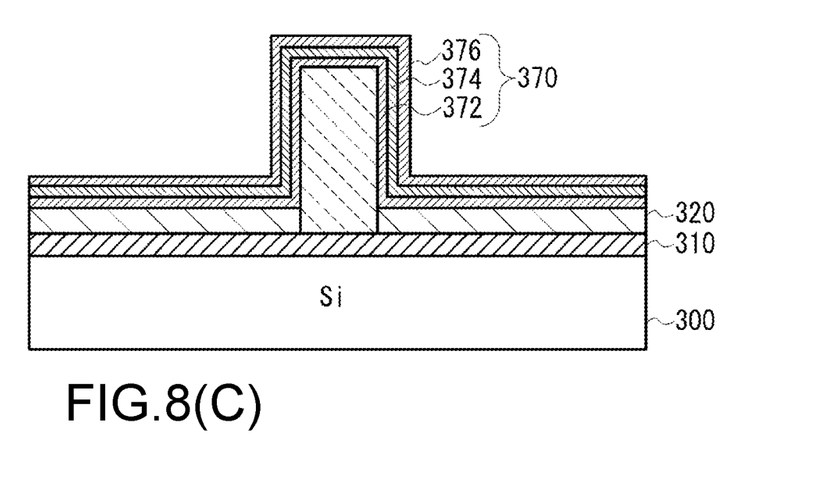

Next, as shown in FIG. 8(C), a charge accumulating part 370 is formed on the first buffer layer 320 and the pillar parts 120. The charge accumulating part 370 is an ONO structure of a first oxide film (O) 372, a nitride film (N) 374, and a second oxide film (O) 376.

Figure 9A:
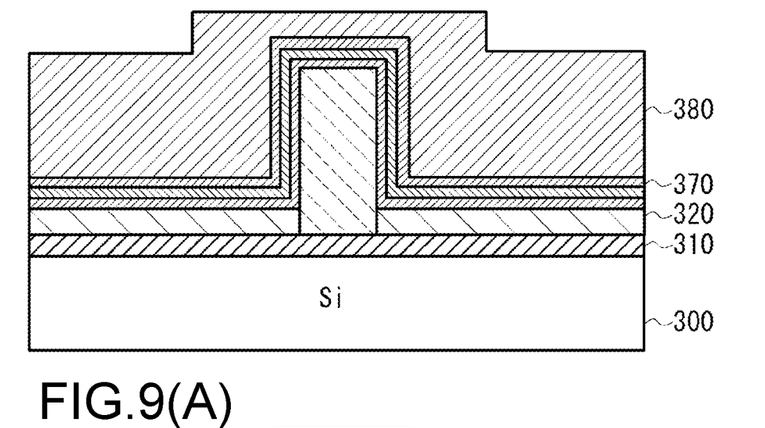

Next, as shown in FIG. 9(A), a conductive layer 380 for constituting the selecting gate is formed to cover the charge accumulating part 370. The conductive layer 380 may be, for example, a polycrystalline silicon doped with impurities or a metal material such as Al, Cu, or the like. In addition, the conductive layer 380 may also include the polycrystalline silicon and one or more metal layers (for example, TiN, W) formed on the polycrystalline silicon.

Figure 9B:
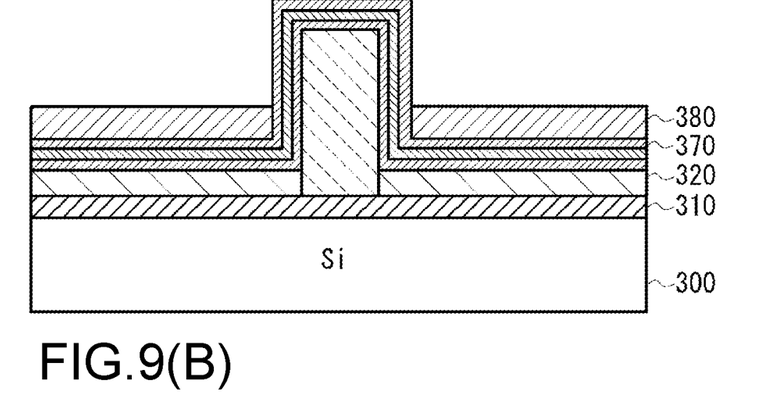

Next, as shown in FIG. 9(B), the conductive layer 380 is etched so that the charge accumulating part 370 is exposed. Etching of the conductive layer 380 does not have any particular limitations, but may be, for example, performed by a two-step process. Initially, the conductive layer 380 is planarized by the CMP to expose the top of the charge accumulating part 370, then the conductive layer 380 is etched by an etchant having selectivity with respect to the charge accumulating part 370 to reduce the thickness of the conductive layer 380. As a result, the charge accumulating part 370 on top of the pillar part 120 is exposed, and a closed band-shaped conductive layer 380 covering side of the pillar part 120 may be obtained.

Figure 9C:
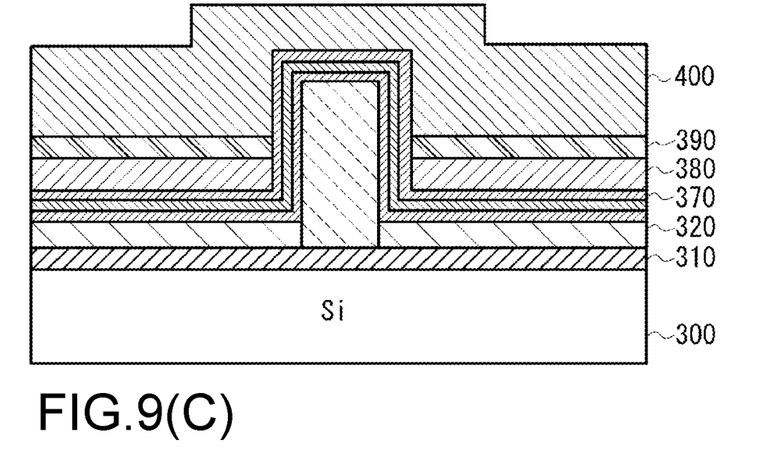

Next, on an entire surface of the substrate, after an interlayer insulating film 390 such as a silicon oxide film or the like is formed, as shown in FIG. 9(C), the interlayer insulating film 390 is etched back so that the interlayer insulating film 390 is left on the conductive layer 380, and then a conductive layer 400 for constituting a control gates is formed to cover the interlayer insulating film 390 and the charge accumulating part 370. The conductive layer 400 may be a polycrystalline silicon doped with impurities or a metal material such as Al, Cu or the like. Accordingly, the conductive layer 380 may also include the polycrystalline silicon and one or more metal layers (for example, TiN, W) formed on the polycrystalline silicon.

Figure 10A:
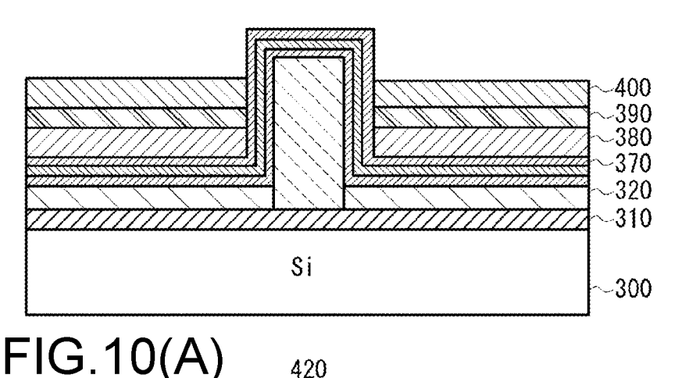

Next, the conductive layer 400 is etched in the same manner as the conductive layer 380 is etched. As shown in FIG. 10(A), the charge accumulating part 370 covering top of the pillar part 120 is exposed, and a closed band-shaped conductive layer 400 covering side of the pillar part 120 and separated from the conductive layer 380 by the interlayer insulating film 390 may be obtained.

Figure 10B:
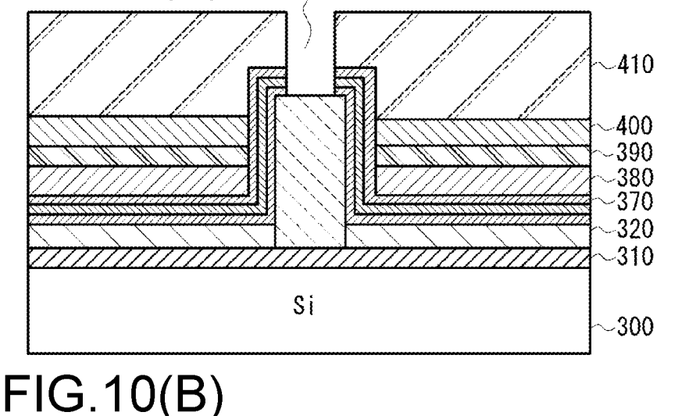

Next, as shown in FIG. 10(B), on an entire surface of the substrate, an interlayer insulating film 410 such as a silicon oxide film or the like, is formed. Then, a mask layer (omitted in the drawings) such as a photoresist or the like, is formed on the interlayer insulating film 410, and an opening is formed on the mask layer through a lithography process. Next, the interlayer insulating film 410 and the charge accumulating part 370 are partially etched which is determined by the opening of the mask layer to form a contact hole 420 exposing the pillar part 120.

Figure 10C:
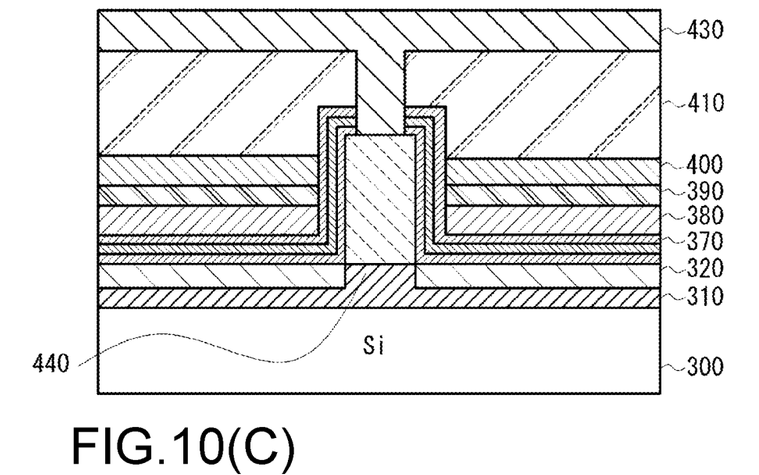

Next, as shown in FIG. 10(C), a metal material 430 for constituting the bit lines fills up the contact hole 420 and is formed on the interlayer insulating film 410. The metal material 430 is, for example, Al or Cu or the like. Then, the metal material 430 is patterned to form bit lines through the lithography process. In addition, in the processes of FIG. 7(D) to FIG. 10(B), a certain temperature is applied to the substrate, such that impurities of the high impurity layer 310 are diffused to end of the pillar part 120, and an n-type source diffusion region 440 is formed at the end of the pillar part 120. A thickness of the first buffer layer 310 is adjusted to be substantially equal to a distance of the impurities diffused from the high impurity layer 310.

By forming the high impurity layer 310, that is, the source line SL, on the entire surface of the silicon substrate 300, the source diffusion regions 440 of all the memory cells of the memory cell array can be jointly connected to the source line SL. Alternatively, by forming a plurality of high impurity layers 310 in selected regions on the surface of the silicon substrate 300, the source lines SL can be jointly connected to the source diffusion regions 440 of the selected memory cells. Also, peripheral circuits such as sense amplifiers and decoders may be formed on the silicon substrate 300 below the memory cell array.

In the manufacturing method, the high impurity layer 310 is directly formed on the surface of the silicon substrate 300. However, a high-melting point metal layer or a metal silicide layer may be formed between the high impurity layer 310 and the silicon substrate, to withstand the high temperature process.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A NOR flash memory, comprising:
a substrate;
a source line formed on a surface of the substrate for providing a reference potential;
a pillar part extending in a vertical direction from the surface of the substrate, and comprising a conductive semiconductor material, wherein the pillar part has a top end above a bottom end, and the bottom end of the pillar part is electrically connected to the reference potential via the source line;
a bit line disposed on the top end of the pillar part, and electrically connected to the pillar part via a contact hole;
a set of the NOR flash memory including a plurality of NOR flash memory cells and a plurality of selecting transistors, wherein the plurality of NOR flash memory cells of the set are connected to the bit line in parallel, and each of the plurality of selecting transistors of the set is connected between the source line and a corresponding one of the plurality of NOR flash memory cells; and
an interlayer insulating film formed between a first one of the plurality of NOR flash memory cells and a first one of the plurality of selecting transistors, wherein the pillar part has a first portion between a top surface of the interlayer insulating film and the top end of the pillar part, and the pillar part has a second portion between a bottom surface of the interlayer insulating film and the bottom end of the pillar part;
wherein each of the plurality of selecting transistors comprises:
an insulating film formed by surrounding the second portion of the pillar part; and
a selecting gate formed below the interlayer insulating film to surround the insulating film, wherein each of the plurality of NOR flash memory cells is connected in series to a corresponding one including the first one of the selecting transistors, and comprises:
a charge accumulating part formed by surrounding the first portion of the pillar part, wherein the charge accumulating part includes a material different from that of the insulating film; and
a control gate formed on the interlayer insulating film so as to surround the charge accumulating part.

2. The NOR flash memory according to claim 1, wherein the first one of the plurality of selecting transistors functions as a current limiting transistor to limit current supplied from the first one of the plurality of NOR flash memory cells, and
electrons are injected from a source side of the first one of the plurality of NOR flash memory cells to the charge accumulating part.

3. The NOR flash memory according to claim 1, further comprising:
a row selecting component, connected to the control gate of each of the plurality of NOR memory cells and the selecting gate of each of the plurality of selecting transistors, and configured to select the control gates of the first one of the plurality of NOR memory cells and the selecting gates of the first one of the plurality of selecting transistors in a row direction based on a row address; and
a column selecting component, selecting the bit line and the source line in a column direction based on a column address, wherein a number of the plurality of NOR flash memory cells and a number of the plurality of selecting transistors in the set are the same.

4. The NOR flash memory according to claim 1, wherein the charge accumulating part comprises a first oxide film, a nitride film and a second oxide film, and the insulating film is made of the first oxide film or the second oxide film.

5. The NOR flash memory according to claim 1, wherein a conductive region is formed on the substrate and is configured to be supplied with the reference potential.

6. The NOR flash memory according to claim 5, wherein the conductive region includes an impurity layer.

7. The NOR flash memory according to claim 6, wherein, the charge accumulating part comprises a first oxide film, a nitride film and a second oxide film.

8. The NOR flash memory according to claim 1, wherein, the charge accumulating part is separated from the insulating film.

9. The NOR flash memory according to claim 1, wherein, the charge accumulating part is connected to the insulating film.

10. The NOR flash memory according to claim 1, further comprising a control part configured to execute a programming operation including applying a programing voltage on the control gate of the NOR flash memory cell, and applies a selecting voltage smaller than the programming voltage to the selecting gate of the selecting transistor connected in series to the NOR flash memory cell.

11. The NOR flash memory according to claim 1, wherein a number of the plurality of NOR flash memory cells and a number of the plurality of selecting transistors in the set are the same.

12. A NOR flash memory, comprising:
a substrate; po1 a source line formed on a surface of the substrate for providing a reference potential;
a pillar part extending in a vertical direction from the surface of the substrate, and comprising a conductive semiconductor material, wherein the pillar part has a top end above a bottom end, and the bottom end of the pillar part is electrically connected to the reference potential via the source line;
a first buffer layer formed on the source line; a bit line disposed on the top end of the pillar part, and electrically connected to the pillar part via a contact hole;
a set of the NOR flash memory including a plurality of NOR flash memory cells and a plurality of selecting transistors, wherein the plurality of NOR flash memory cells of the set are connected to the bit line in parallel, and each of the plurality of selecting transistors of the set is connected between the source line and a corresponding one of the plurality of NOR flash memory cells; and
an interlayer insulating film formed between a first one of the plurality of NOR flash memory cells and a first one of the plurality of selecting transistors, wherein the pillar part has a first portion between a top surface of the interlayer insulating film and the top end of the pillar part, and the pillar part has a second portion between a bottom surface of the interlayer insulating film and the bottom end of the pillar part;
wherein each of the plurality of selecting transistors comprises:
a first charge accumulating part formed by surrounding the second portion of the pillar part and formed on top surface of the first buffer layer; and
a selecting gate formed below the interlayer insulating film to surround the first charge accumulating part, such that a part of the first charge accumulating part is between the first buffer layer and the selecting gate;
wherein each of the plurality of NOR flash memory cells is connected in series to a corresponding one including the first one of the selecting transistors, and comprises:
a second charge accumulating part formed by surrounding the first portion of the pillar part, wherein the second charge accumulating part and the first charge accumulating part are made of a same material; and
a control gate formed on the interlayer insulating film so as to surround the second charge accumulating part.

13. The NOR flash memory according to claim 12, further comprising:
a row selecting component, selecting the control gate of the first one of the plurality of NOR memory cells and the selecting gate of the first one of the plurality of selecting transistors in a row direction based on a row address; and
a column selecting component, selecting the bit line and the source line in a column direction based on a column address.

14. The NOR flash memory according to claim 12, wherein
a conductive region is fonned on the substrate and is configured to be supplied with the reference potential.

15. The NOR flash memory according to claim 14, wherein the conductive region includes an impurity layer.

16. The NOR flash memory according to claim 12, wherein the first charge accumulating part and the second charge accumulating part comprise a first oxide film, a nitride film and a second oxide film.

17. The NOR flash memory according to claim 12, wherein the first charge accumulating part is separated from the second charge accumulating part.

18. The NOR flash memory according to claim 12, wherein a number of the plurality of NOR flash memory cells and a number of the plurality of selecting transistors in the set are the same.

\* \* \* \* \*